United States Patent
Kitagawa et al.

(10) Patent No.: US 11,270,758 B2
(45) Date of Patent: Mar. 8, 2022

(54) APPARATUSES, SYSTEMS, AND METHODS FOR SYSTEM ON CHIP REPLACEMENT MODE

(71) Applicant: MICRON TECHNOLOGY, INC., Boise, ID (US)

(72) Inventors: Katsuhiro Kitagawa, Hachioji (JP);
Yoshihito Morishita, Shibuya-ku (JP);
Daigo Toyama, Fujisawa (JP);
Takamasa Suzuki, Hachioji (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/942,503

(22) Filed: Jul. 29, 2020

(65) Prior Publication Data

US 2022/0036939 A1 Feb. 3, 2022

(51) Int. Cl.
*G11C 7/00* (2006.01)
*G11C 11/408* (2006.01)
*G11C 11/406* (2006.01)

(52) U.S. Cl.
CPC .... *G11C 11/4087* (2013.01); *G11C 11/40615* (2013.01)

(58) Field of Classification Search
CPC .............. G11C 11/4078; G11C 11/40615
USPC ............................................. 365/222
See application file for complete search history.

(56) References Cited

U.S. PATENT DOCUMENTS

| | | | | |
|---|---|---|---|---|
| 4,951,050 A | * | 8/1990 | Khan | H03M 5/20 341/73 |
| 2002/0048197 A1 | * | 4/2002 | La | G11C 8/18 365/193 |
| 2019/0088308 A1 | * | 3/2019 | Kwon | G11C 11/4093 |

* cited by examiner

*Primary Examiner* — Huan Hoang
(74) *Attorney, Agent, or Firm* — Dorsey & Whitney LLP

(57) ABSTRACT

Apparatuses, systems, and methods for a system on chip (SoC) replacement mode. A memory device may be coupled to a SoC which may act as a controller of the memory. Commands and addresses may be sent along a command/address (CA) bus to a first decoder of the memory. The first decoder may use a first reference voltage to determine a value of signals along the CA bus. One of the pins of the CA bus may be coupled to a second decoder which may use a different second reference voltage. When the voltage on the pin exceeds the second reference voltage, the memory device may enter a SoC replacement mode, in which the memory may take various actions to preserve data integrity, while a new SoC comes online.

19 Claims, 6 Drawing Sheets

APPARATUSES, SYSTEMS, AND METHODS FOR SYSTEM ON CHIP REPLACEMENT MODE

BACKGROUND

Semiconductor devices may include a controller and a memory. The controller may operate the memory, for example by providing commands to the memory and sending and receiving data to and from the memory. The memory may be a volatile memory which only stores information while it is powered on. There may be situations where the controller needs to be replaced. However, if the device is powered off to swap out the controller, the information in the memory may be lost. There may be a need for ways to switch out the controller without losing the information stored in the memory.

DETAILED DESCRIPTION

Figure 1:
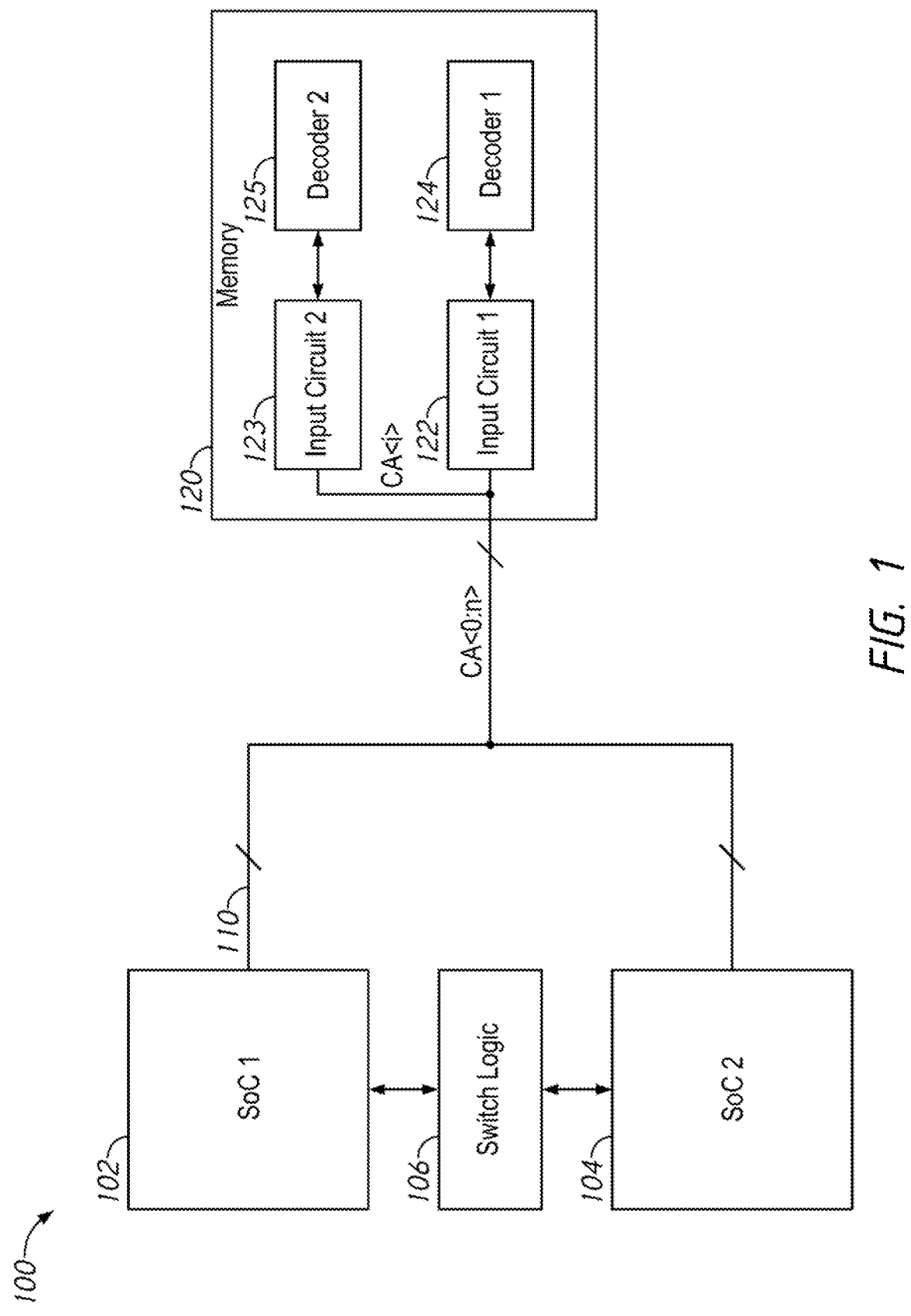
FIG. 1 is a block diagram of a system including a memory according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A device may include a memory and a system-on-chip (SoC) which acts as a controller for the memory. The SoC may send various commands to the memory along a command address (CA) bus, which may include one or more parallel channels which connect to input terminals (pins) of the memory. Each pin may receive signals in series using a voltage on the pin to distinguish between input levels. For example, a first voltage may represent a high logical signal, while a second voltage may represent a low logical level. The first and second voltage may represent a 'normal' voltage range for the input pins.

There may be circumstances where it is useful and/or necessary to change the SoC without powering down the memory, as that would lose the information stored in the memory. For example, if the SoC runs a critical system, like an automotive AI, it may be necessary to seamlessly transition to a new SoC if the old one breaks. It may be useful to enter the memory into a replacement mode to prepare it for SoC transition without requiring an increase in the number of CA pins of the memory.

The present disclosure is drawn to apparatuses, systems, and methods for a SoC replacement mode. The memory may include a second input circuit and decoder which are coupled in parallel to one of the CA pins along with a primary input buffer and decoder. The primary input buffer and decoder may respond to voltage levels within a voltage range. The second input circuit and decoder may respond when the voltage on the pin is above a threshold voltage (e.g., a reference voltage), which is outside the voltage range. The second decoder may provide a one or more internal command signals which may enter the memory into a SoC replacement mode. During the SoC replacement mode, the memory may perform self-refreshes and/or other operations to maintain data integrity, and may ignore inputs on the CA pins except for a replacement mode exit command. In some embodiments, the same pin used to enter the replacement mode may be used to exit the replacement mode. In some embodiments, a first pin may be used to enter the replacement mode, while a second pin is used for exiting the replacement mode.

FIG. 1 is a block diagram of a system including a memory according to some embodiments of the present disclosure. The system 100 includes a memory device 120, which is coupled to a first system on chip (SoC) 102 and a second SoC 104. The first SoC 102 acts as controller of the memory 120 and is coupled to the memory 120 via a command/address (CA) bus 110, which is used to carry a CA signal. It may be necessary to switch from using the first SoC 102 as the controller of the memory 120 to using the second SoC 104 as the controller of the memory 100, without losing the data stored in the memory 100.

In some embodiments, the memory may be coupled to both SoCs 102 and 104 in common, and one SoC may be active and acting as the controller. For example, the system 100 may be used to manage a critical function, such as being used to manage automatic driving, and it may be important to maintain functionality even if one of the SoCs fails. Thus, the first SoC 102 may be a primary SoC, and the second SoC 104 may be a backup SoC. When a failure is detected in the primary SoC, the system 100 may switch to using the backup SoC.

In some embodiments, the system 100 may normally include a single SoC (e.g., first SoC 102) and the second SoC 104 may be coupled to the CA bus 110 so that the second SoC may take over as the controller of the memory 120, which may allow the first SoC 102 to be removed. For example, in some situations the system 100 may malfunction, and second SoC 104 may be swapped into the system 100 to help diagnose and/or resolve the problem.

In order to switch from using the first SoC 102 to the second SoC 104 as the controller, the memory 120 may be entered into a 'replacement mode'. The memory 120 may be entered into the replacement mode by a replacement mode entry signal, which may be provided along the CA bus 110. The replacement mode may protect the data in the memory 120. While in the replacement mode, the memory 120 may refresh itself to preserve the information stored therein. In the replacement mode, the memory 120 may also ignore inputs along the CA bus 110 (except for the signal which exits it from the replacement mode). This may protect the memory 120 from errant signals which may be generated while the SoC's are switched.

The signals which enter and exit the memory 120 to and from the replacement mode may be provided along the CA bus 110. To cut down on the number of physical connections (e.g., pins) along the CA bus 110, existing pins may be used for the replacement mode entry and replacement mode exit signals. In the embodiment of FIG. 1, the same pin may be used for both the replacement mode entry and exit signals. Other embodiments (e.g., the one discussed in FIG. 6) may use different pins for the entry and exit signals.

The CA bus 110 may include a number of different conductive elements CA<0> to CA<n>, each of which may carry signals in series. The signals may be represented by a voltage of the conductive element. For example, a first voltage may represent a high logical level, while a second voltage may represent a low logical level. An input circuit 122 of the memory 120 may receive the voltages along the different CA bus 110 lines and may filter and/or buffer the voltages along the line. For example, the input circuit 122 may remove noise. The input circuit 122 may provide the input signals to the decoder 124, which may determine what commands and/or addresses are represented by the voltages along the line. For example, if the first signal line includes a first voltage, the decoder 124 may interpret that as a high logical level, and provide one or more internal signals based on the meaning of that signal.

The memory 120 may also include a second input circuit 123 and second decoder 125, which are coupled to one of the signal lines (e.g., pins) of the CA bus 110, and are used to receive a replacement mode entry command. In the embodiment of FIG. 1, the second input circuit 123 is coupled to a particular pin CA<i> of the CA bus 110. Thus, both the primary and second input circuits 122 and 123 may receive signals along the pin CA<i>. During normal operations, the voltages along the command bus 110, such as along pin CA<i> may fall within a voltage range. The voltage range may represent a range of voltages between the voltages which the first decoder 124 uses as a high and low logical level. The second decoder 125 may interpret a voltage outside the range of the first decoder 124 as a replacement mode entry signal.

For example, the first decoder 124 may generally use a first voltage V1 to represent a high logical level and a second voltage V0 to represent a low logical level. The voltage on the pin CA<i> may generally vary between V1 and V0 (and may also go slightly above V1 and slightly below V0). The normal voltage range may therefore be between V1 and V0 (and/or between a voltage just above V1 and a voltage below V0). The first decoder 124 may use a reference voltage Vth as a threshold. The reference voltage Vth may be between V1 and V0 and the first decoder may judge any voltage above Vth as a logical high and any voltage below Vth as a low logical level. To prevent confusion between the normal signals along CA<i>, the second decoder 125 may only respond to a voltage which is outside the voltage range used by the first decoder 124. For example, the second decoder 125 may use a second reference voltage Vth2, which is outside the voltage range of the first decoder 124 (e.g., the voltage Vth2 may be above the voltage V1). The second decoder 125 may interpret a voltage on the pin CA<i> which is greater than the second reference voltage Vth2 (e.g., outside of the normal voltage range) as a replacement mode entry command. Since such a high voltage would not normally be present on the pin CA<i>, the use of the reference Vth2 in the second decoder 125 may help prevent confusion between normal signals and the replacement mode entry command, without the need for the use of an additional pin. In this manner, the pin CA<i> may carry three commands, normal high and low signals interpreted by the first decoder 124 and a replacement mode entry command interpreted by the second decoder 125.

In the embodiment of FIG. 1, the voltage along the pin CA<i> may also be used as a replacement mode exit command. For example, when the voltage on the pin CA<i> rises above the threshold reference voltage Vth2 of the second decoder 125, the decoder 125 may interpret that as a replacement mode entry command. When the voltage on the pin CA<i> falls below the threshold reference voltage Vth2, the second decoder 125 may interpret that as a replacement mode exit command.

The system 100 may include switch logic 106, which may be used to manage the transition from a first SoC 102 to a second SoC 104. For example, in a replacement operation, the first SoC 102 may provide a replacement mode entry signal to the memory (e.g., by raising the voltage of the signal line CA<i> above the reference voltage threshold Vth2 of the second decoder 125). This may cause the memory 120 to begin self-refreshing. The switch logic 106 may then instruct the second SoC 104 to activate, and the second SoC 104 may power up or wake up from a sleep mode. In some embodiments, the second SoC 104 may begin providing the voltage on CA<i> above the reference voltage threshold Vth2. Once the second SoC is online, the switch logic 106 may signal that the first SoC 102 may be shut down. Since the second SoC 104 is still providing the voltage along the line CA<i> above Vth2, the memory 120 may remain in replacement mode. Once the second SoC 104 is ready to take over operations, the second SoC 104 may provide an exit replacement mode signal, for example by lowering the voltage along the pin CA<i> below the reference voltage threshold Vth2. The second SoC 104 may then begin providing normal communications along the CA bus 110. In some embodiments, the two SoCs 102 and 104 may communicate through the switch logic, for example, so that the second SoC 104 may resume the operations which the first SoC was performing.

In some embodiments, rather than both being coupled to the CA bus 110 in common, the first and the second SoC 102 and 104 may be coupled to the switch logic 106 in common. The switch logic 106 may provide the replacement mode entry and exit signals, responsive to commands from the first SoC 102, and may act as a pass-through for the CA bus 110 otherwise.

In some embodiments, rather than remove the SoC 102 in order to replace it with a different SoC 104, the replacement mode may be used to decouple the memory 120 from the SoC 102 for a period of time. For example, the SoC 102 may enter the memory 120 into the replacement mode, and may then be removed and tested and then replaced, which may then send a replacement mode exit signal to recouple the SoC 102 to the memory 120.

In some embodiments, there may be a single connector between the memory 120 and the SoC 102. The replacement logic 106 may be omitted. The first SoC 102 may send a replacement mode entry signal, placing the memory 120 into the replacement mode. The first SoC 102 may then be removed, and the second SoC 104 may be plugged in to the connector to the CA bus 110 instead. The second SoC 104 may then provide a replacement mode exit signal, which may return the memory to normal operations, now with the SoC 104 acting as the controller of the memory. The memory 120 may hold a replacement mode enable signal, which may be set to an active level by the replacement mode entry signal. The state of the replacement mode enable signal may be saved in the memory 120 (e.g., in a latch) and the memory may remain in the replacement mode while the replacement mode enable signal is active. The replacement mode exit signal may reset the replacement mode enable signal to an inactive level. Storing an enable signal in a latch of the memory 120 may be used in any of the other embodiments described herein, but may be particularly useful in embodiments where the SoC is disconnected completely during replacement, since the voltage along the CA bus 110 may be uncontrolled while there is no controller connected.

Figure 2:
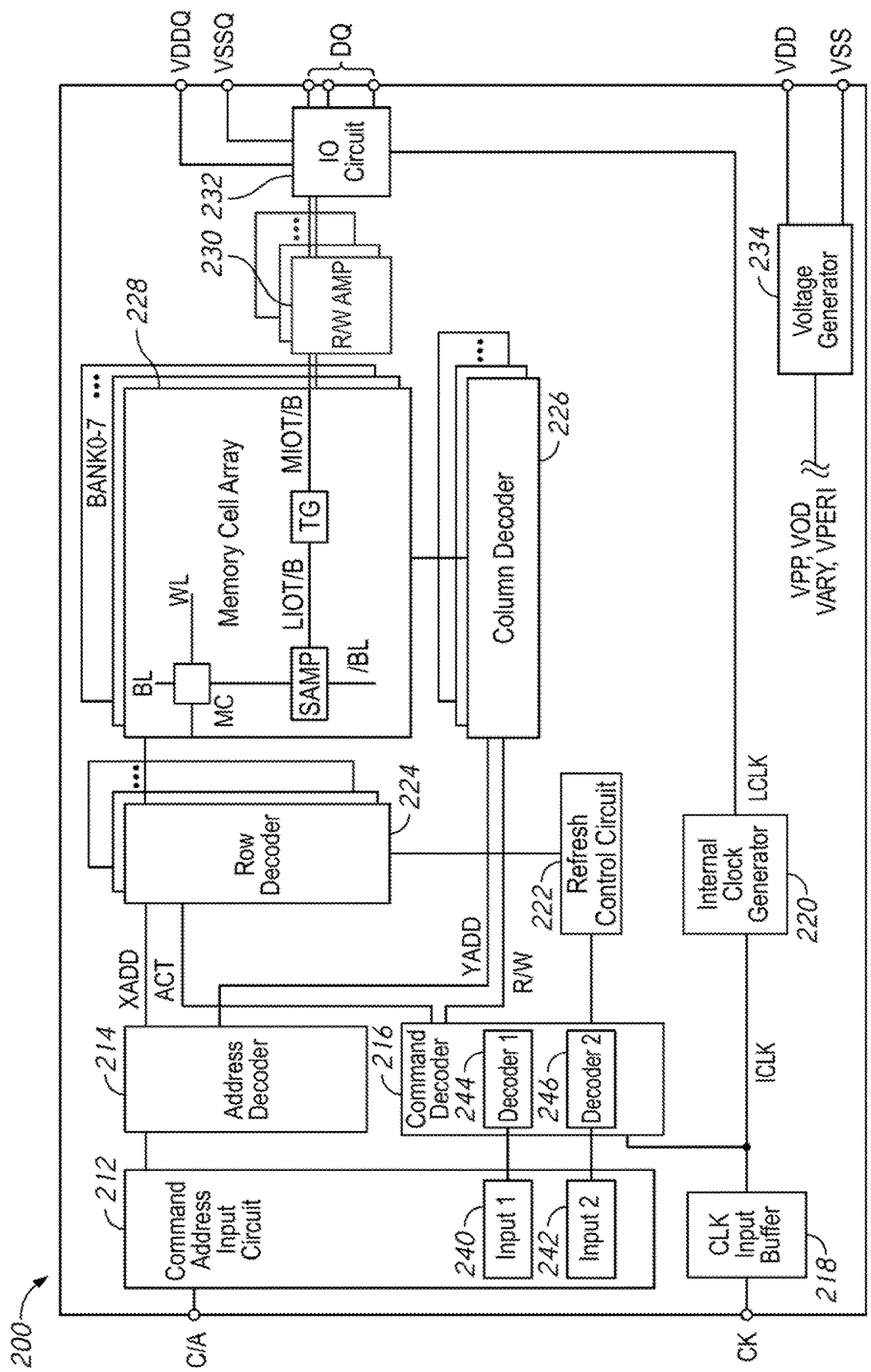
FIG. 2 is a block diagram of an apparatus according to an embodiment of the disclosure.

FIG. 2 is a block diagram of an apparatus according to an embodiment of the disclosure. The apparatus may be a semiconductor device 200, and will be referred to as such. The device 200 may be included in the memory 120 of FIG. 1. In some embodiments, the semiconductor device 200 may include, without limitation, a DRAM device.

The semiconductor device 200 includes a memory array 228. The memory array 228 is shown as including a plurality of memory banks. In the embodiment of FIG. 2, the memory array 228 is shown as including eight memory banks BANK0-BANK7. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 224 and the selection of the bit lines BL and /BL is performed by a column decoder 226. In the embodiment of FIG. 2, the row decoder 224 includes a respective row decoder for each memory bank and the column decoder 226 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 230 over complementary local data lines (LIOT/B), transfer gate (TG), and complementary main data lines (MIOT/B). Conversely, write data outputted from the read/write amplifiers 230 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 200 may employ a plurality of external terminals that include command and address (CA) terminals coupled to a command and address bus (e.g., 110 of FIG. 1) to receive commands and addresses, and clock terminals to receive clock signals CK_t and CK_c, and data clock signals WCK_t and WCK_c, and to provide access data clock signals RDQS_t and RDQS_c, data terminals DQ and DM, and power supply terminals to receive power supply potentials VDD, VSS, VDDQ, and VSSQ. The various terminals of the device 200 may generally be referred to as 'pins' and may be coupled to conductive elements which carry the signals to the pins. For example, there may be a number of CA pins, each of which may receive signals as voltages. Each CA pin may receive signals in a series format, with the voltage level varying over time to indicate different logic levels.

The clock terminals are supplied with external clock signals CK_t and CK_c that are provided to an input buffer 218. The external clock signals may be complementary. The input buffer 218 generates an internal clock ICLK based on the CK_t and CK_c clock signals. The ICLK clock is provided to the command decoder 216 and to an internal clock generator 220. The internal clock generator 220 provides various internal clock signals LCLK based on the ICLK clock. The LCLK clock signals may be used for timing operation of various internal circuits. In some embodiments, data clocks (not shown) may also be provided to control the operation of data being written to/read from the device 200.

The CA terminals may be supplied with memory addresses. The memory addresses supplied to the CA terminals are transferred, via a command/address input circuit 212, to an address decoder 214. The address decoder 214 receives the address and supplies a decoded row address XADD to the row decoder 224 and supplies a decoded column address YADD to the column decoder 226. The CA terminals may be supplied with commands. Examples of commands include timing commands for controlling the timing of various operations, access commands for accessing the memory, such as read commands for performing read operations and write commands for performing write operations, mode register write and read commands for performing mode register write and read operations, as well as other commands and operations.

The commands may be provided as internal command signals to a command decoder 216 via the command/address input circuit 212. The command decoder 216 includes circuits to decode the internal command signals to generate various internal signals and commands for performing operations. For example, the command decoder 216 may provide a row command signal ACT to select a word line and a column command signal R/W to select a bit line.

The command address input circuit 212 may include a first set of input circuits 240 and a second input circuit 242. The input circuit 240 (e.g., input circuit 122 if FIG. 1) may be coupled to the CA pins, and may be used for processing command signals along the CA bus, except for replacement mode entry and exit signals. The input circuit 242 (e.g., input circuit 124 of FIG. 1) may process command signals along the CA bus related to the replacement mode (e.g., replacement mode entry/exit signals). In some embodiments more of the CA pins may be coupled to the first input circuit 240 than are coupled to the second input circuit 242. For example, only one CA pin may be coupled to the second input circuit 242. The pins which are coupled to the second input circuit 242 may also be coupled to the first input circuit 240.

The input circuits 240 and 242 may be act as buffers for the signals along the coupled CA pins. The input circuits 240 and 242 may pass the buffered signals along to the command decoder 216. The second input circuit 242 may process different voltages than the first input circuit 240. In some embodiments, the input circuit 242 may be coupled to different system voltages than the input circuit 240. For example, the second input circuit 242 may be coupled to a higher voltage than the first input circuit 240.

The command decoder 216 may include a first set of decoders 244 and a second decoder 246. The first set of decoders 244 (e.g., decoder 124 of FIG. 1) may process commands except for the commands related to the replacement mode. For example, the first input circuit 240 may be coupled to the first decoder 244, while the second input circuit 242 may be coupled to the second decoder 246. The first decoder 244 may provide various commands such as read or write command R/W and row activation commands ACT. The second decoder 246 may provide internal signals which put the memory device 200 into a replacement mode or exit the memory 200 from the replacement mode.

When a read command is received, and a row address and a column address are timely supplied with the read command, read data is read from memory cells in the memory array 228 corresponding to the row address and column address. The read command is received by the command decoder 244, which provides internal commands so that read data from the memory array 228 is provided to the read/write amplifiers 230. The read data is output to outside from the data terminals DQ via the input/output circuit 232.

When the write command is received, and a row address and a column address are timely supplied with the write command, write data supplied to the data terminals DQ is written to a memory cells in the memory array 228 corresponding to the row address and column address. A data mask may be provided to the data terminals DM to mask portions of the data when written to memory. The write command is received by the command decoder 244, which provides internal commands so that the write data is received by data receivers in the input/output circuit 232. The write data is supplied via the input/output circuit 232 to the read/write amplifiers 230, and by the read/write amplifiers 230 to the memory array 228 to be written into the memory cell MC.

When a replacement mode entry signal is received, the memory device 200 may enter a replacement mode. During the replacement mode, the memory device 200 may take various actions to preserve the integrity of data in the memory array 228. For example, the memory 200 may instruct a refresh control circuit 222 to enter a self-refresh mode. Data may decay over time in the memory array 228. To prevent the data from decaying, the value in the memory cells may be refreshed back to an initial value. In a self-refresh mode, the refresh control circuit 222 may refresh memory cells at a rate such that each memory cell is refreshed before the information stored therein is expected to decay. For example, the refresh control circuit 222 may refresh the memory cells on a row-by-row basis, and may cycle through the rows of the memory array 228. The self-refresh mode may also be activated during other times which are not part of the replacement mode.

The refresh control circuit 222 may receive a refresh signal AREF. The memory may be entered into a self-refresh mode by an external signal, such as an external refresh signal or a command entering the memory device 200 into a replacement mode. Once in a self-refresh mode, the memory 200 may generate activations (e.g., pulses) of the refresh signal AREF. Responsive to each activation of the refresh signal AREF, the memory may refresh one or more word lines. For example, responsive to an activation of AREF, the refresh control circuit 222 may provide a number of 'pumps' each of which may be associated with one or more refresh addresses. The refresh addresses may be provided to the row decoder 224, which may refresh the word lines. The signal AREF may continue to be periodically generated until the memory exits the self-refresh mode (e.g., responsive to a replacement mode exit command). The refresh control circuit 222 may use internal logic to generate the refresh addresses. For example the refresh control circuit 222 may have a sequence generator which provides a refresh address from a sequence of refresh addresses.

In some embodiments, the refresh control circuit 222 may additionally identify memory cells which are at risk of a faster rate of memory decay and refresh them out of sequence. For example, repeated accesses to a given row (a 'row hammer') may cause nearby rows to experience faster information decay. The refresh control circuit 222 may identify these victim rows (e.g., based on access patterns) and refresh them as part of a targeted refresh. In some embodiments, the refresh control circuit 222 may mix refreshing rows in sequence and targeted refreshes.

During a replacement mode, the command decoder 246 may provide signals to the input circuit 212 and/or decoder 244 which cause the memory device 200 to ignore signals on the CA bus (except for the replacement mode exit command). For example, in embodiments where the replacement mode exit command is received by the second decoder 246, the memory device 200 may disable the input circuit 240 and/or decoder 244 to prevent them from responding to voltages along the CA bus.

The power supply terminals are supplied with power supply potentials VDD and VSS. The power supply potentials VDD and VSS are supplied to an internal voltage generator circuit 234. The internal voltage generator circuit 234 generates various internal potentials VPP, VOD, VARY, VTARGET, VPERI, and the like based on the power supply potentials VDD and VSS supplied to the power supply terminals. The internal potential VPP is mainly used in the row decoder 224, the internal potentials VOD and VARY are mainly used in the sense amplifiers SAMP included in the memory array 228, VTARGET may be a target voltage for the internal potential VARY, and the internal potential VPERI is used in many peripheral circuit blocks.

The power supply terminals are also supplied with power supply potentials VDDQ and VSSQ. The power supply potentials VDDQ and VSSQ are supplied to the input/output circuit 232. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 232 so that power supply noise generated by the input/output circuit 232 does not propagate to the other circuit blocks.

Figure 3:
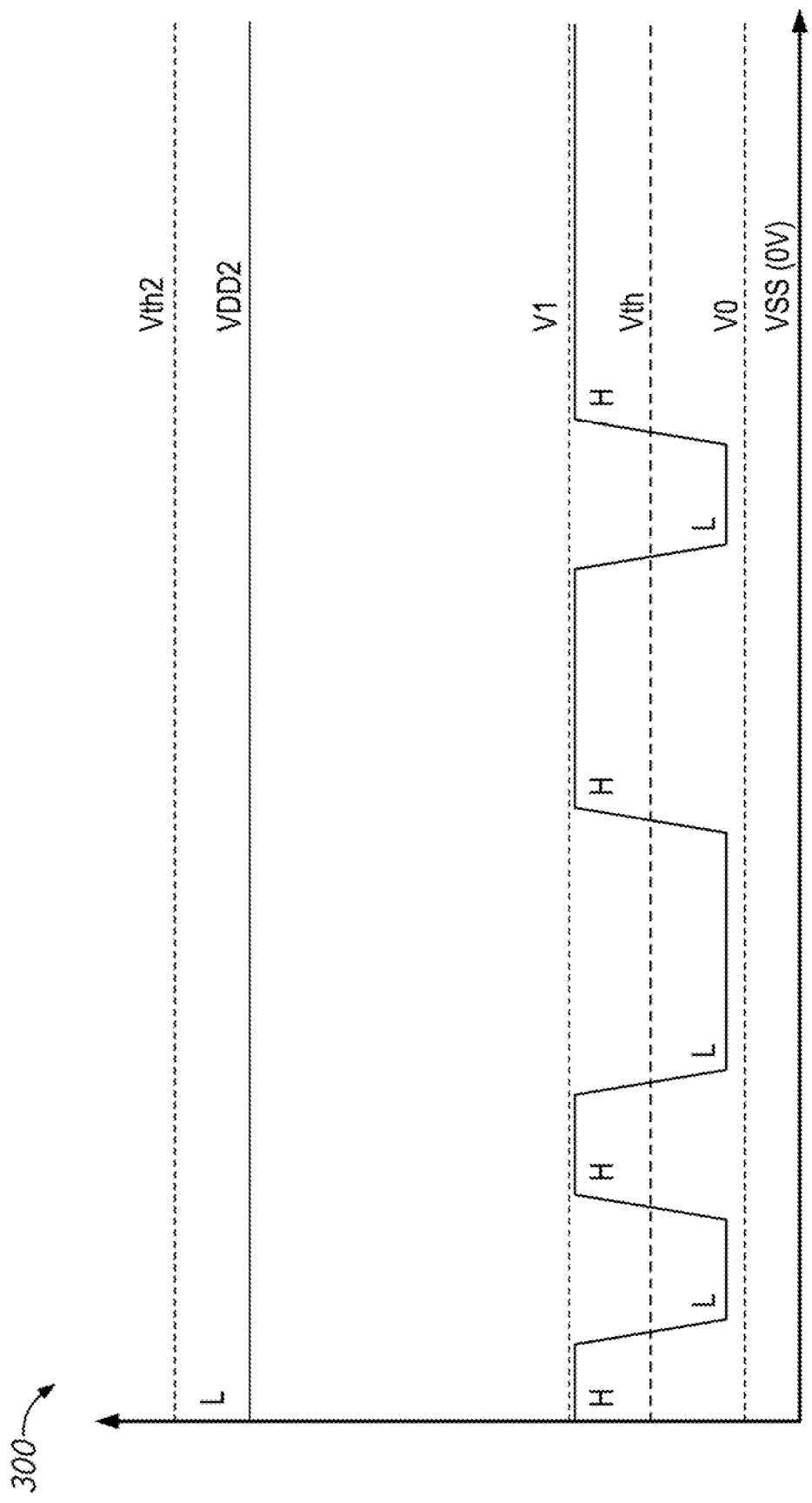
FIG. 3 is a graph of signal operations according to some embodiments of the present disclosure.

FIG. 3 is a graph of signal operations according to some embodiments of the present disclosure. The graph 300 shows voltages over time along a signal line of the CA bus (e.g., CA bus 110 of FIG. 1) during normal operations. The graph 300 may represent signals along a signal line (e.g., CA<i> of FIG. 1) which is coupled to both primary and second input circuits and decoders.

The graph 300 shows an operation of signals along the CA line and various example voltages which are used by the input buffers and decoders. The primary input circuit (e.g., 122 of FIG. 1) and the primary decoder (e.g., 124 of FIG. 1) may use voltage levels based on a system voltage VDD2 and a ground voltage VSS. For example, the ground voltage VSS may be set as 0V, and the system voltage VDD2 may be 1.1V relative to the ground voltage VSS. Other voltages may be used in other examples. The input circuit and decoder may operate using voltage dividers to set various voltage levels between VDD2 and VSS. For example, a voltage V1 which represents a high logical level along the signal line may be about 40% of VDD2. A voltage V0 which represents a low logical level along the signal line may be about 10% of VDD2. A reference voltage threshold Vth may be between V1 and V0, for example about 27.2% of VDD2. Other ratios of the system voltage may be used in other example embodiments, for example V1 may be 50%, 30%, etc. of VDD2.

As the signal varies over time, the threshold Vth is used to determine if the signal is interpreted at a high or low logical level. When the voltage on the pin coupled to the signal line is above Vth, the signal may be interpreted as a high logical level. When the voltage on the pin is below Vth, the signal may be interpreted as a low logical level. Accordingly, the voltage on the pin may stay between a voltage range which is generally between V1 and V0.

The second input circuit and decoder may use a different threshold Vth2 to determine if the signal is positive or not. When the voltage on the pin is above the second threshold Vth2, the second decoder may interpret that as a replacement mode entry signal. As may be seen in FIG. 3, during 'normal' operations, the voltage on the signal line may remain well below the voltage Vth2 (e.g., since V1<Vth2) and the second decoder may not activate.

In some embodiments, the voltage may be chosen such that voltage on the signal line will not rise above Vth2 under normal circumstances. For example, Vth2 may be selected such that it is greater than the system voltage VDD2 used for normal communications on the CA bus. Since the system voltage VDD2 is normally the maximum value that signals on the CA bus may have, the second decoder will not be activated. For example, the threshold Vth2 may be based on a second system voltage (e.g., VDD). The voltage VDD may be higher than VDD2. For example, if the voltage VDD2 is 1.1 V, and the voltage VDD is 2.5 V, then the voltage Vth2 may be set at 50% of VDD. The second system voltage (e.g., VDD) may be used to generate the higher voltages of the replacement mode entry command along the CA bus.

Figure 4:
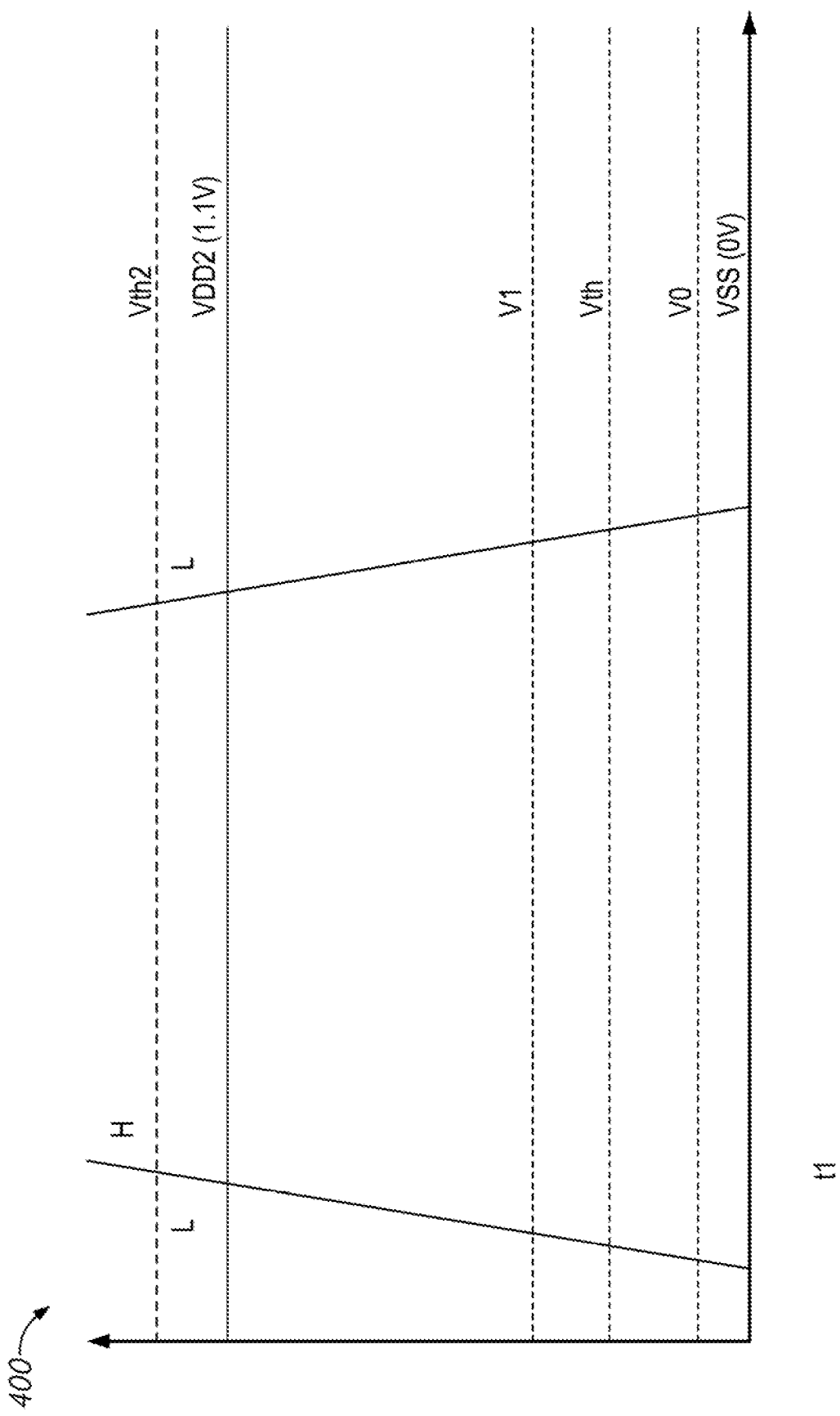
FIG. 4 is a graph of signal operations during a replacement mode according to some embodiments of the present disclosure.

FIG. 4 is a graph of signal operations during a replacement mode according to some embodiments of the present disclosure. The graph 400 may be generally similar to the graph 300 of FIG. 3, except that rather than 'normal' operations, the graph 400 shows a signal used as part of a replacement mode. For the sake of brevity, features and operations previously described with respect to FIG. 3 will not be repeated again with respect to FIG. 4.

The graph 400 shows the same signal line (and pin) as the one shown in FIG. 3, but in FIG. 4 the pin is being used to enter and exit a replacement mode of the memory. At a first time, the voltage on the signal line rises above the second threshold voltage Vth2. This causes the second decoder (e.g., 125 of FIG. 1) to interpret the signal as a high logical level. The second decoder may then provide various signals which indicate an entry into a replacement mode.

The memory may remain in the replacement mode until a replacement mode exit signal is received. For example, at a second time (e.g., after the first time), a second pulse along the signal line may rise above second threshold voltage Vth2 (e.g., in a manner similar to the pulse received at the first time). The second decoder may interpret this second pulse as a replacement mode exit signal, and the second decoder may provide various signals which indicate an exit from the replacement mode. Normal communications (e.g., similar to those shown in FIG. 3) may then be resumed along the pin.

For example, the second decoder may include a latch which holds a replacement mode active signal. When the voltage on the pin rises above the second threshold, a pulse may be provided to a clock terminal of the latch, which may change a state of the replacement mode active signal. Accordingly, the latch may default to holding a the replacement mode active signal at an inactive (e.g., low logical level). The voltage rising above Vth2 may cause the state of the replacement mode active signal to switch to an active (e.g., high) level, which may cause the memory to enter a replacement mode. A subsequent time when the voltage rises above Vth2 may return the state of the replacement mode active signal to the inactive level, returning the memory to a normal operational mode.

Figure 5:
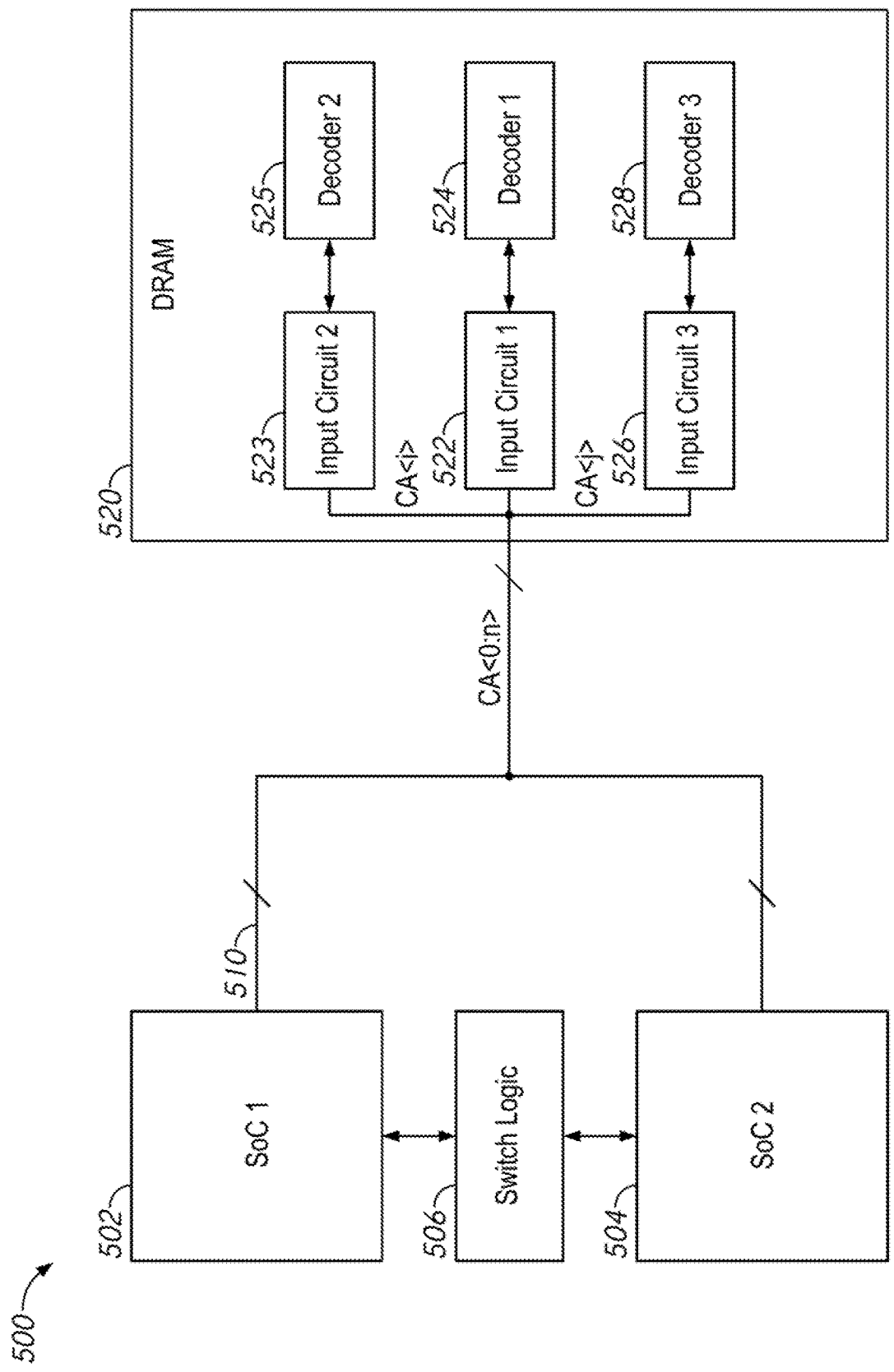
FIG. 5 is a block diagram of a system including a memory according to some embodiments of the present disclosure.

FIG. 5 is a block diagram of a system including a memory according to some embodiments of the present disclosure. The system 500 may generally be similar to the system 100 of FIG. 1, except that in the system 500, a first pin (e.g., CA<i>) is used to carry replacement mode entry commands, and a second pin (e.g., CA<j>) is used to carry replacement mode exit commands. For the sake of brevity, features and operations already described with respect to FIG. 1 will not be repeated again with respect to FIG. 5.

The system 500 includes a memory 520 which is coupled along a CA bus 510 to a first SoC 502, which acts as a controller. The system 500 may switch from the first SoC 502 to using a second SoC 504 as the controller (e.g., which may be done with timing based on switch logic 506). In order to preserve information in the memory 520, and to protect the memory 520 from errant signals along the CA bus 510, the memory 520 may be entered into a replacement mode during the transition from the first SoC 502 to the second SoC 504, and may then exit the replacement mode to resume normal operations with the second SoC 504 acting as the controller. For example, a replacement mode entry signal may be sent along the CA bus 510 to enter the memory 520 into the replacement mode, and then a replacement mode exit signal may be sent along the CA bus 510 to cause the memory 520 to exit the replacement mode.

For example, a first conductive element/pin of the CA bus 510, such as pin CA<i> may be used to carry the replacement mode entry command. Information may normally be carried along the CA bus 510 as voltages, which may fall within a voltage range (e.g., similar to FIG. 3). The replacement mode entry command may be carried as a signal which is a voltage outside the normal voltage range (e.g., similar to FIG. 4). The pin CA<i> may be coupled to a primary input circuit 522 and decoder 524, which process signals within the normal voltage range, and a second input circuit 523 and decoder 525. The second decoder 525 may have a voltage threshold which is outside the normal voltage range of the primary decoder 524. When the voltage on CA<i> is greater than the threshold of the second decoder 525, the decoder 525 may interpret this as a replacement mode entry signal and may generate internal signals to enter the memory 520 into the replacement mode. During the replacement mode the memory 520 may perform self-refresh operations.

When it is time for the replacement mode to end, a replacement mode exit signal may be provided along the CA bus 510. Rather than using the same pin (e.g., as in FIG. 1), in the system 500, a different pin may be used to carry the replacement mode exit command. For example, while the pin CA<i> is used to carry the replacement mode entry command, a pin CA<j> may be used to carry the replacement mode exit command. The pin CA<j> may be coupled in common to the primary input circuit 522 and primary decoder 524 and to a third input circuit 526 and third decoder 528. The third decoder 528 may respond to a voltage which is outside the voltage threshold of the primary decoder 524 in a manner analogous to the second decoder 525. For example, the third decoder 528 may use a voltage threshold which is outside the voltage range of the primary decoder 524. In some embodiments, the third decoder 528 may have the same threshold as the second decoder 525. Responsive to a voltage along the pin CA<j> which is greater than the threshold of the third decoder 528, the third decoder 528 may provide various internal signals which may exit the memory 520 from the replacement mode.

In some embodiments, while in the replacement mode, the memory 520 may also ignore commands along the CA bus 510 while in the replacement mode. This may help protect the memory 520 from errant voltages that may be generated along the CA bus 510 during the transition. In the system 500, after the replacement mode entry command is received at pin CA<i>, the memory may ignore further voltages along CA<i> and may only respond to a voltage along CA<j> which is greater than the threshold voltage of the third decoder 528.

Similar to the system 100 of FIG. 1, there may be different configurations of the system 500 in different embodiments. For example, in some embodiments, rather than both being coupled in parallel, the memory 520 may have a CA bus 510 with a single connector to a controller (e.g., one of the SoC's). Accordingly, in an example operation, the first SoC 502 may be coupled to the CA bus 510 and may provide a replacement mode entry signal (e.g., along pin CA<i>) which may put the memory 520 into a replacement mode. The first SoC 502 may then be disconnected from the CA bus 510 and replaced with the second SoC 504. Once it is ready to begin operations, the second SoC may provide a replacement mode exit signal (e.g., along pin CA<j>) which may return the memory 520 to normal operation, this time with the second SoC 504 acting as the controller. In some embodiments, the switch logic 506 may be omitted.

Figure 6:
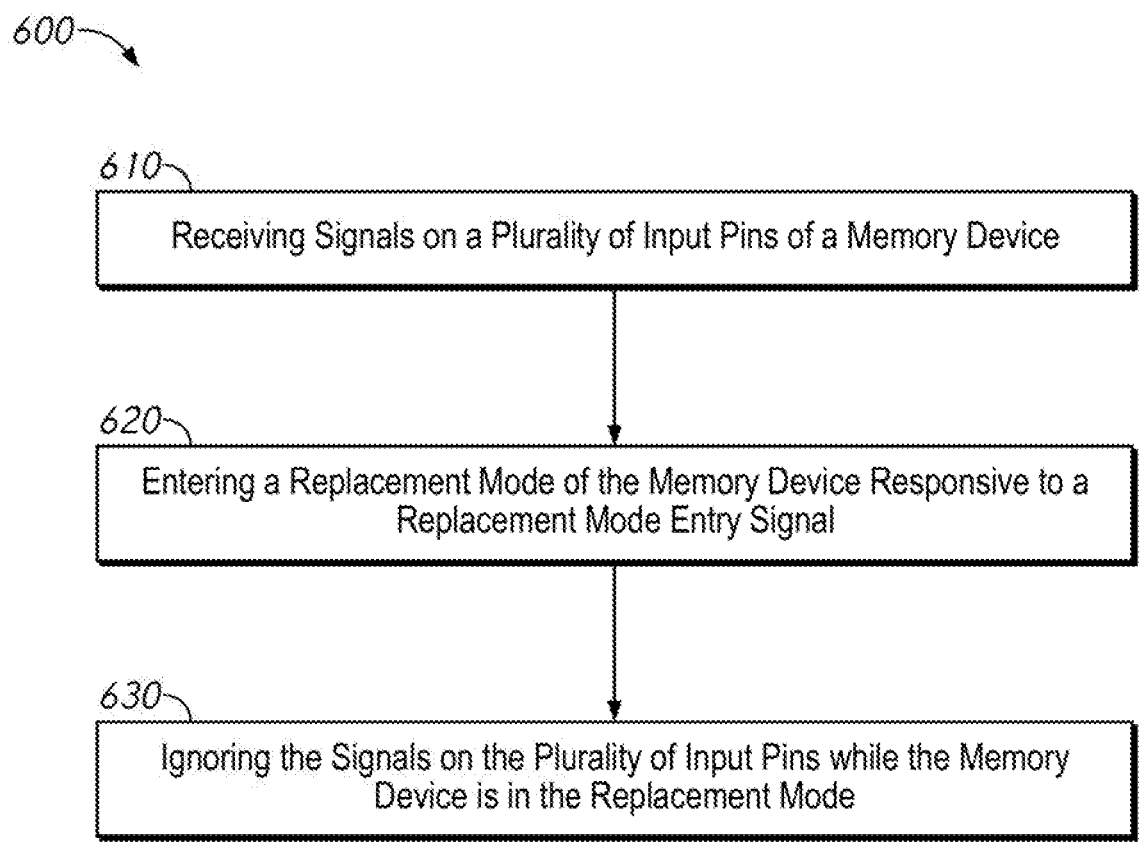
FIG. 6 is a flow chart of a method of entering a system-on-chip (SoC) replacement mode according to some embodiments of the present disclosure.

FIG. 6 is a flow chart of a method of entering a system-on-chip (SoC) replacement mode according to some embodiments of the present disclosure. The method 600 may be performed by one or more of the devices and systems of FIGS. 1-5.

The method 600 may generally begin with box 610 which describes receiving signals on a plurality of input pins of a memory device. The signals may be represented by voltages within a voltage range. For example, a decoder of the memory may interpret a first voltage (e.g., V1 of FIG. 3) as a high logical level, and interpret a second voltage (e.g., V0 of FIG. 3) as a low logical level. The voltages on the input pins may generally be in a range between V1 and V0 (and/or between voltages just above V1 and just below V0). The input pins may be coupled to a decoder which compares the received voltage to a threshold voltage to determine if the received voltage on the input pin represents a high or a low level. For example if the voltage is higher than the threshold voltage then the voltage may represent a high logical level and if the voltage is lower than the threshold voltage then the voltage may represent a low logical level.

The input pins may be part of a command address CA input bus, and the input pins may receive commands, addresses, or combinations thereof. The commands may indicate operations that the memory device should perform, while the addresses may indicate locations within a memory array of the memory device.

The method 600 may include box 620, which describes entering a replacement mode of the memory device responsive to a replacement mode entry signal. The replacement mode entry signal may be represented by a voltage on one of the plurality of input pins crossing a voltage threshold which is outside the voltage range. For example, one of the input pins may be coupled to a second decoder (as well as to the first decoder). The second decoder may compare the voltage to a second threshold voltage (e.g., Vth2 of FIG. 3-4) which is different than the first threshold voltage used by the first decoder. For example, the second threshold voltage may be outside the voltage range (e.g., greater than V1).

Box 620 may generally be followed by box 630, which describes ignoring the signals on the plurality of input pins while the device is in the replacement mode. The memory device may take various actions to protect the integrity of the information stored therein during the replacement mode. For example the memory device may ignore voltages on the input pins except for the replacement mode exit signal. In some embodiments, the memory device may ignore signals received by the decoder which processes commands and addresses. The memory may also perform other operations to preserve information integrity. For example the method 600 may include refreshing word lines of a memory array while the memory device is in the replacement mode.

The method 600 may also include exiting the replacement mode responsive to a replacement mode exit signal. The replacement mode exit signal may be represented by the voltage on the one of the plurality of input pins used for the replacement mode entry command crossing the voltage threshold. For example a rising edge may represent the replacement mode entry while a falling edge may represent a replacement mode exit. The replacement mode exit signal may be represented by the voltage on another of the plurality of input pins crossing a second voltage threshold. For example a first pin may be used for replacement mode entry signals and a second pin may be used for replacement mode exit signals.

The replacement mode may be useful when transitioning the memory device from a first SoC to a second SoC. For example, the method 600 may include receiving commands from a first system-on-chip (SoC) before entering the replacement mode, exiting the replacement mode, and receiving commands from a second SoC after exiting the replacement mode.

It is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
    an input pin and a plurality of other input pins;
    a first decoder circuit coupled to the input pin, the first decoder circuit configured to compare a voltage on the input pin to a first reference voltage; and
    a second decoder circuit coupled to the input pin, wherein the second input decoder circuit is configured to compare the voltage on the input pin to a second reference voltage different than the first input voltage, wherein responsive to the voltage on the input pin being greater than the second reference voltage, the apparatus is configured to ignore signals along the plurality of other input pins.

2. The apparatus of claim 1, further comprising:
a memory array; and
a refresh control circuit, wherein responsive to the voltage on the input pin being greater than the second reference voltage, the refresh control circuit is configured to begin refreshing the memory array.

3. The apparatus of claim 1, further comprising:
a second input pin, wherein the first decoder circuit is coupled to the second input pin and is further configured to compare a voltage on the second input pin to the first reference voltage; and
a third decoder circuit coupled to the second input pin, wherein the third decoder circuit is configured to compare the voltage on the second input pin to a third reference voltage.

4. The apparatus of claim 3, wherein the third reference voltage is the same as the second reference voltage.

5. The apparatus of claim 1, wherein the input pin is coupled to a command address bus.

6. The apparatus of claim 1, further comprising:
a first input circuit coupled between the input pin and the first decoder circuit, wherein the first input circuit is configured to buffer the voltage of the input pin; and
a second input circuit coupled between the input pin and the second decoder circuit, wherein the second input circuit is configured to buffer the voltage of the input pin.

7. A method comprising:
receiving signals on a plurality of input pins of a memory device, wherein the signals are represented by voltages within a voltage range;
entering a replacement mode of the memory device responsive to a replacement mode entry signal, wherein the replacement mode entry signal is represented by a voltage on one of the plurality of input pins crossing a reference voltage which is outside the voltage range; and
ignoring the signals on the plurality of input pins while the memory device is in the replacement mode.

8. The method of claim 7, further comprising refreshing word lines of a memory array while the memory device is in the replacement mode.

9. The method of claim 7, further comprising exiting the replacement mode responsive to a replacement mode exit signal, wherein the replacement mode exit signal is represented by the voltage on the one of the plurality of input pins crossing the reference voltage.

10. The method of claim 7, further comprising exiting the replacement mode responsive to a replacement mode exit signal, wherein the replacement mode exit signal is represented by the voltage on another of the plurality of input pins crossing a second reference voltage.

11. The method of claim 7 further comprising:
receiving commands from a first system-on-chip (SoC) before entering the replacement mode;
exiting the replacement mode; and
receiving commands from a second SoC after exiting the replacement mode.

12. The method of claim 7, wherein the signals on the plurality of input pins comprise commands, addresses, and combinations thereof.

13. The method of claim 7, further comprising:
comparing the voltage on the one of the plurality of input pins to the reference voltage with a first decoder circuit to determine if the voltage represents the replacement mode entry signal; and
comparing the voltage on the one of the plurality of input pins to a different reference voltage with a second decoder circuit to determine a state of the signals.

14. A system comprising:
a memory device configured to store information;
a first system on chip (SoC) configured to act as a controller of the memory device;
a second SoC; and
a command address (CA) bus coupling the first SoC and the second SoC to the memory device,
wherein the first SoC is configured to provide a replacement mode entry signal along the CA bus to put the memory device in a replacement mode,
wherein the memory device is configured to preserve the information in the memory device while in the replacement mode, and
wherein the second SoC is configured to take over as the controller of the memory device.

15. The system of claim 14, wherein while in the replacement mode the memory device is configured to refresh a memory array of the memory device and ignore signals along the CA bus except for a replacement mode exit signal.

16. The system of claim 15, wherein the second SoC is configured to provide a replacement mode exit signal along the CA bus, and wherein responsive to the replacement mode exit signal the memory device exits the replacement mode.

17. The system of claim 16, wherein the CA bus comprises a plurality of pins, and wherein the replacement mode entry signal is carried by a same one of the plurality of pins as the replacement mode exit signal.

18. The system of claim 16, wherein the CA bus comprises a plurality of pins, and wherein the replacement mode entry signal is carried by a different one of the plurality of pins as the replacement mode exit signal.

19. The system of claim 14, wherein the replacement mode entry signal is a voltage outside a voltage range of other signals on the CA bus.

* * * * *